(12) United States Patent
Huang et al.

(10) Patent No.: US 7,629,199 B2
(45) Date of Patent: Dec. 8, 2009

(54) METHOD FOR FABRICATING SEMICONDUCTOR PACKAGE WITH BUILD-UP LAYERS FORMED ON CHIP

(75) Inventors: Chien-Ping Huang, Taichung Hsien (TW); Yu-Po Wang, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 2 days.

(21) Appl. No.: 11/713,362

(22) Filed: Mar. 1, 2007

(65) Prior Publication Data

US 2007/0158861 A1    Jul. 12, 2007

Related U.S. Application Data

(62) Division of application No. 10/632,709, filed on Jul. 31, 2003, now Pat. No. 7,205,674.

(30) Foreign Application Priority Data

May 14, 2003    (TW) ............................ 92113023 A

(51) Int. Cl.
    *H01L 21/00* (2006.01)
(52) U.S. Cl. ................. 438/105; 257/E21.504
(58) Field of Classification Search ................ 438/106, 438/105; 257/E21.504
    See application file for complete search history.

(56) References Cited

U.S. PATENT DOCUMENTS

| | | | |
|---|---|---|---|
| 5,434,751 A * | 7/1995 | Cole et al. ................. 361/792 |
| 5,578,869 A | 11/1996 | Hoffman et al. | |
| 5,745,984 A * | 5/1998 | Cole et al. ................. 29/834 |
| 5,886,401 A * | 3/1999 | Liu ................. 257/678 |
| 6,154,366 A * | 11/2000 | Ma et al. ................. 361/704 |
| 6,266,251 B1 * | 7/2001 | Bassi et al. ................. 361/761 |
| 6,495,914 B1 * | 12/2002 | Sekine et al. ................. 257/723 |
| 6,791,168 B1 * | 9/2004 | Connell et al. ................. 257/668 |
| 7,170,152 B2 * | 1/2007 | Huang et al. ................. 257/678 |
| 2003/0015342 A1 * | 1/2003 | Sakamoto et al. ................. 174/250 |
| 2004/0001324 A1 * | 1/2004 | Ho et al. ................. 361/761 |
| 2004/0214373 A1 * | 10/2004 | Jiang et al. ................. 438/110 |

* cited by examiner

*Primary Examiner*—Kiesha L Rose
*Assistant Examiner*—Igwe U Anya
(74) *Attorney, Agent, or Firm*—Peter F. Corless; Steven M. Jensen; Edwards Angell Palmer & Dodge LLP

(57) ABSTRACT

A semiconductor package with build-up layers formed on a chip and a fabrication method of the semiconductor package are provided. A chip with a plurality of conductive bumps formed on bond pads thereof is received within a cavity of a carrier, and a dielectric layer encapsulates the conductive bumps whose ends are exposed. A plurality of conductive traces are formed on the dielectric layer and electrically connected to the ends of the conductive bumps. A solder mask layer is applied over the conductive traces and formed with openings via which predetermined portions of the conductive traces are exposed and bonded to a plurality of solder balls. Thereby, positions of the bond pads are easily recognized and distinguished by the exposed ends of the conductive bumps, making the conductive traces capable of being well electrically connected through the conductive bumps to the bond pads to improve yield of the fabricated packages.

12 Claims, 3 Drawing Sheets

METHOD FOR FABRICATING SEMICONDUCTOR PACKAGE WITH BUILD-UP LAYERS FORMED ON CHIP

CROSS-REFERENCE TO RELATED APPLICATION(S)

This application is a divisional of copending application U.S. Ser. No. 10/632,709, filed on Jul. 31, 2003.

FIELD OF THE INVENTION

The present invention relates to semiconductor packages and fabrication methods of the same, and more particularly, to a semiconductor package with build-up layers formed on a chip incorporated in the semiconductor package and a method for fabricating the semiconductor package.

BACKGROUND OF THE INVENTION

A semiconductor package is incorporated with at least one integrated circuit component such as semiconductor chip and preferably made compact in size. In response to this goal, a chip scale package (CSP) is desirably developed whose size is equal to or only slightly larger than the size of the semiconductor chip.

A conventional CSP is illustrated in FIG. 3 which directly fabricates a plurality of build-up layers on a semiconductor chip without using a chip carrier such as substrate or lead frame for accommodating the chip. As shown, the plurality of build-up layers are formed on an active surface 100 of the chip 10, including: a dielectric layer 11 disposed over the active surface 100 of the chip 10 and formed with a plurality of vias 110 by which bond pads 101 on the chip 10 are exposed; and a plurality of conductive traces 12 formed on the dielectric layer 11 and electrically connected to the exposed bond pads 101 of the chip 10. A solder mask layer 13 is applied over the conductive traces 12 and formed with a plurality of openings 130, allowing predetermined portions of the conductive traces 12 to be exposed via the openings 130 and bonded to solder balls 14 which serve as input/output (I/O) connections for the package to be electrically connected to an external device (not shown). This CSP structure, however, is defective of not able to provide more surface area, which is limited in accordance with the chip size, for accommodating more solder balls required for the external electrical connection.

Accordingly, another package structure with build-up layers formed on an encapsulated chip is disclosed in U.S. Pat. No. 6,271,469 to provide additional surface area for external I/O connections. As shown in FIG. 4, this package structure utilizes an encapsulant 15 to encapsulate a non-active surface 102 and side surfaces 103 of the chip 10, making the active surface 100 of the chip 10 exposed and flush with a surface 150 of the encapsulant 15. After the dielectric layer 11 (hereinafter referred to as "first dielectric layer") and conductive traces 12 (hereinafter referred to as "first conductive traces") are formed on the chip 10, a second dielectric layer 16 is disposed over the first conductive traces 12 and formed with a plurality of vias 160 to expose predetermined portions of the first conductive traces 12 by the vias 160. A plurality of second conductive traces 17 are formed on the second dielectric layer 16 and electrically connected to the exposed portions of the first conductive traces 12. Then, the solder mask layer 13 is applied over the second conductive traces 17, allowing predetermined portions of the second conductive traces 17 to be exposed via the openings 130 of the solder mask layer 13 and bonded to the solder balls 14.

However, a significant drawback incurred by the above semiconductor packages is that when a laser drilling technique is utilized to form vias through the first dielectric layer, positions of the bond pads on the chip, covered by the first dielectric layer, cannot be easily and precisely recognized by laser, making the vias not able to accurately correspond to the positions of the bond pads. As a result, the bond pads on the chip cannot be completely exposed, thus degrading electrical connection between the conductive traces and the incompletely-exposed bond pads and also damaging yield of the fabricated packages.

Therefore, the problem to be solved herein is to provide a semiconductor package with build-up layers formed on a chip by which bond pads on the chip can be precisely exposed and electrically connected to conductive traces to thereby improve fabrication yield of the semiconductor package.

SUMMARY OF THE INVENTION

A primary objective of the present invention is to provide a semiconductor package with build-up layers formed on a chip and a fabrication method of the semiconductor package, wherein a plurality of conductive bumps are formed on bond pads of the chip to distinguish the positions of the bond pads, so as to assure electrically connection between the bond pads and conductive traces and thereby improve fabrication yield of the semiconductor package.

In accordance with the foregoing and other objectives, the present invention proposes a semiconductor package with build-up layers formed on a chip and a fabrication method of the semiconductor package. This semiconductor package comprises a chip having an active surface and a non-active surface and formed with a plurality of bond pads on the active surface; a conductive bump formed on each of the bond pads of the chip; a carrier having a cavity for receiving the chip therein, wherein the non-active surface of the chip is attached to a bottom surface of the cavity, and a depth of the cavity is between a thickness of the chip and a sum of the thickness of the chip and a height of the conductive bump; a first dielectric layer which is applied over the active surface of the chip and the carrier, and which fills in the cavity and encapsulates the conductive bumps with ends of the conductive bumps being exposed; a plurality of first conductive traces formed on the first dielectric layer and electrically connected to the exposed ends of the conductive bumps; a second dielectric layer applied over the first conductive traces and formed with a plurality of vias by which predetermined portions of the first conductive traces are exposed; a plurality of second conductive traces formed on the second dielectric layer and electrically connected to the exposed portions of the first conductive traces; a solder mask layer applied over the second conductive traces and formed with a plurality of openings via which predetermined portions of the second. conductive traces are exposed; and a solder ball formed on each of the exposed portions of the second conductive traces.

In the above semiconductor package according to the invention, a plurality of conductive bumps are directly formed on the bond pads of the chip, and then a first dielectric layer is coated over the chip and the carrier for accommodating the chip and encapsulates the conductive bumps with ends of the conductive bumps being exposed. As a result, positions of the bond pads are easily recognized and distinguished by the exposed ends of the conductive bumps, such that conductive traces subsequently formed on the first dielectric layer can be well electrically connected through the conductive bumps to the bond pads, thereby improving yield of the fabricated packages. Therefore, the semiconductor package according to the invention, without having to form vias through the first dielectric layer to expose bond pads on the chip, is advantageous over the prior art whose bond pads of the chip cannot be precisely or completely exposed by vias formed through the first dielectric layer in the use of a laser drilling technique and which leads to the drawback of degraded electrical connection between the incompletely-exposed bond pads and conductive traces formed on the first dielectric layer. Moreover, the carrier for accommodating the chip according to the invention can be a metallic heat sink which effectively dissipates heat produced from the chip, thereby improving the heat dissipating efficiency of the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a semiconductor package with build-up layers formed on a chip and a fabrication method of the semiconductor package proposed in the present invention are described with reference to FIGS. 1 and 2A-2F.

Figure 1:
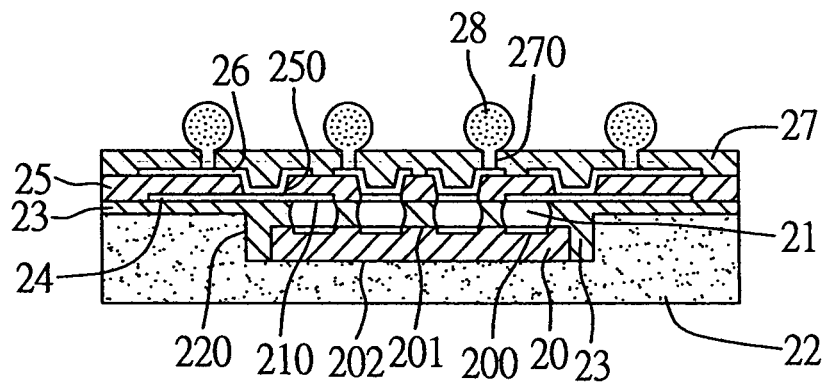
FIG. 1 is a cross-sectional view of a semiconductor package according to a preferred embodiment of the invention.

As shown in FIG. 1, the semiconductor package according to the invention comprises: a chip 20 having an active surface 201 and a non-active surface 202 and formed with a plurality of bond pads 200 on the active surface 201; a conductive bump 21 formed on each of the bond pads 200 of the chip 20; a carrier 22 having a cavity 220 for receiving the chip 20 therein; a first dielectric layer 23 applied over the active surface 201 of the chip 20 and the carrier 22 with ends 210 of the conductive bumps 21 being exposed; a plurality of first conductive traces 24 formed on the first dielectric layer 23 and electrically connected to the exposed ends 210 of the conductive bumps 21; a second dielectric layer 25 applied over the first conductive traces 24 and formed with a plurality of vias 250 by which predetermined portions of the first conductive traces 24 are exposed; a plurality of second conductive traces 26 formed on the second dielectric layer 25 and electrically connected to the exposed portions of the first conductive traces 24; a solder mask layer 27 applied over the second conductive traces 26 and formed with a plurality of openings 270 via which predetermined portions of the second conductive traces 26 are exposed; and a solder ball 28 formed on each of the exposed portions of the second conductive traces 26.

The above semiconductor package can be fabricated by the procedural steps shown in FIGS. 2A to 2F.

Figure 2A:
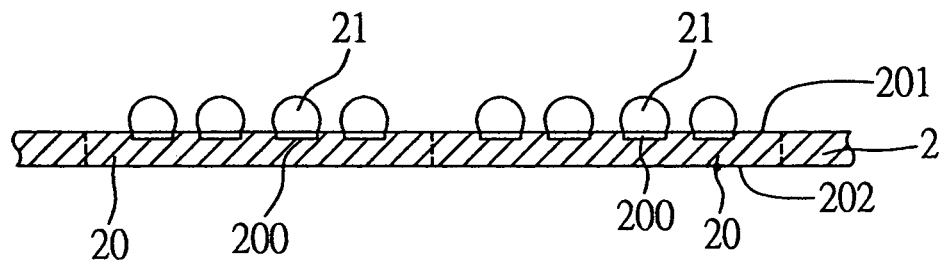
FIGS. 2A-2F are schematic diagrams showing procedural steps for fabricating the semiconductor package shown in FIG. 1.

Referring to FIG. 2A, the first step is to prepare a wafer 2 which is integrally formed of a plurality of chips 20, each chip 20 having an active surface 201 and a non-active surface 202 and formed with a plurality of bond pads 200 on the active surface 201. A bumping or stud bumping process is performed to form a conductive bump 21 on each of the bond pads 200 of the chips 20; the conductive bump 21 can be a solder bump, a gold (Au) bump, an Au stud bump, etc.

Figure 2B:
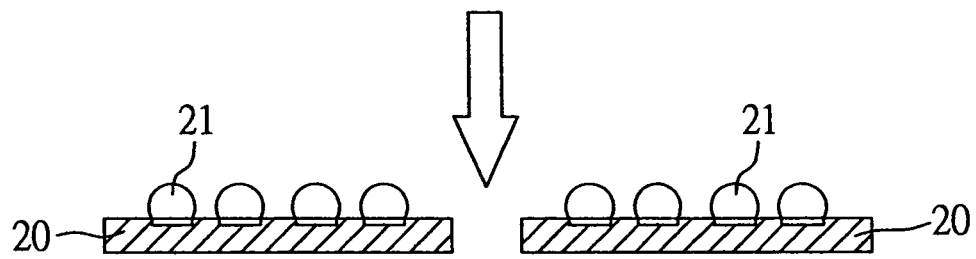

Referring to FIG. 2B, the next step is to implement a singulation process to cut through the wafer 2 and separate the plurality of integrally formed chips 20 into single chips 20, each chip 20 having a plurality of conductive bumps 21 formed thereon.

Figure 2C:
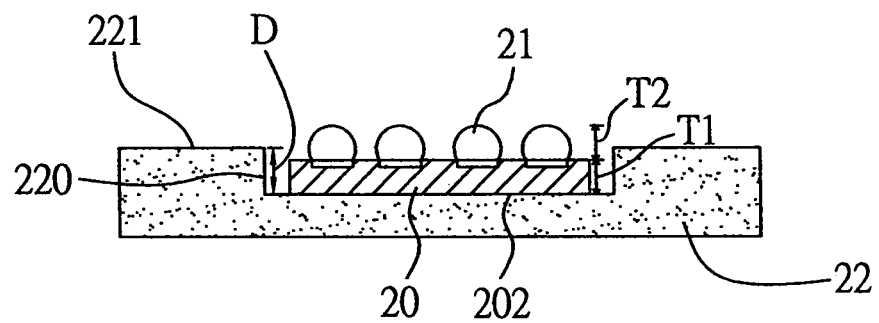

Referring to FIG. 2C, in exemplification of one chip 20, a carrier 22 is prepared, which can be a metallic heat sink or made of a non-conductive material such as ceramic and resin. The carrier 22 is formed with a cavity 220 by which the chip 20 having the plurality of conductive bumps 21 thereon is received within the cavity 220 and the non-active surface 202 of the chip 20 is attached to a bottom surface of the cavity 220 by means of an adhesive (not shown). A depth D of the cavity 220 is between a thickness T1 of the chip 20 and a sum (T1+T2) of the thickness T1 of the chip 20 and a height T2 of the conductive bump 21. The space inside the cavity 220 is required to comfortably receive the entire chip 20 therein, and the conductive bumps 21 on the chip 20 partly protrude from an opening of the cavity 220. The carrier 22 is used to protect the chip 20 from being damaged by external contaminants and provide additional surface area (i.e. a surface 221 of the carrier 22 having the opening of the cavity 220) for subsequently accommodating more I/O (input/output) connections (not shown). In the case of the carrier 22 being a metallic heat sink, the carrier 22 would desirably increase heat dissipation area for effectively dissipating heat generated from the chip 22 to the atmosphere.

Figure 2D:
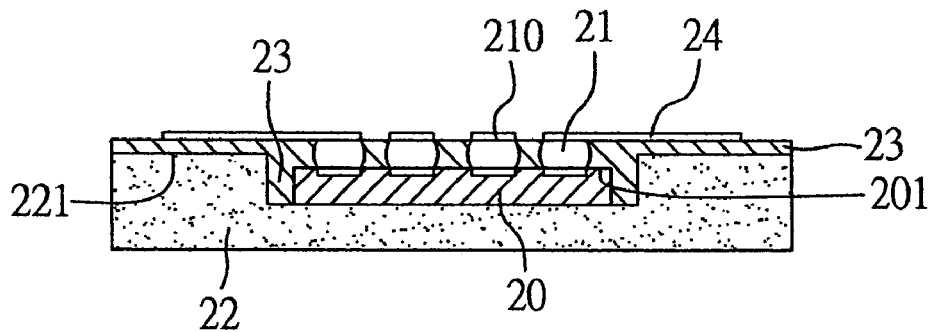

Referring to FIG. 2D, a conventional deposition technique, such as spin coating, is employed to form a first dielectric layer 23 over the active surface 201 of the chip 20 and the surface 221 of the carrier 22. The first dielectric layer 23 fills in the cavity 220 and encapsulates the conductive bumps 21 formed on the active surface 201 of the chip 20. Then, the first dielectric layer 23 is ground or etched to expose ends 210 of the conductive bumps 21, such that subsequent processes can be performed to form build-up layers on the exposed conductive bumps 21.

Thereafter, a plurality of first conductive traces 24 are formed on the first dielectric layer 23 by e.g. a conventional photolithography technique, and each of the first conductive traces 24 is adapted to be electrically connected to at least one of the exposed ends 210 of the conductive bumps 21. The first conductive traces 24 are made of a conductive material such as copper, aluminum, or an alloy thereof.

Figure 2E:
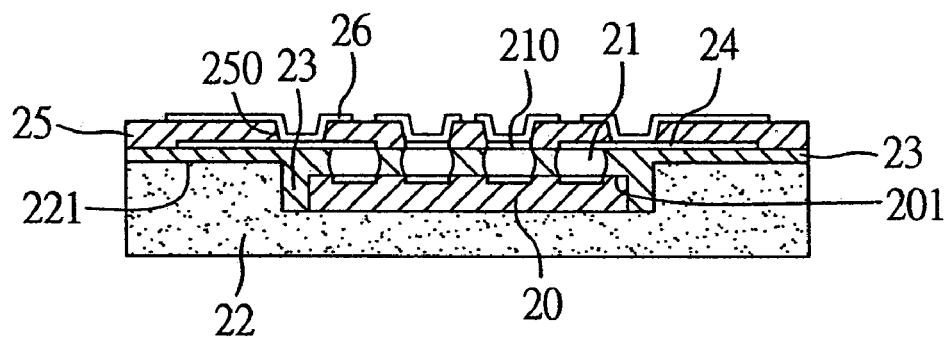

Referring to FIG. 2E, after the first conductive traces 24 are formed, a second dielectric layer 25 is applied over the first conductive traces 24, and a laser drilling technique is employed to form a plurality of vias 250 through the second dielectric layer 25, allowing predetermined portions of the first conductive traces 24 to be exposed by the vias 250. Then, a plurality of second conductive traces 26 are formed on the second dielectric layer 25 and each electrically connected to at least one of the exposed portions of the first conductive traces 24.

Figure 2F:
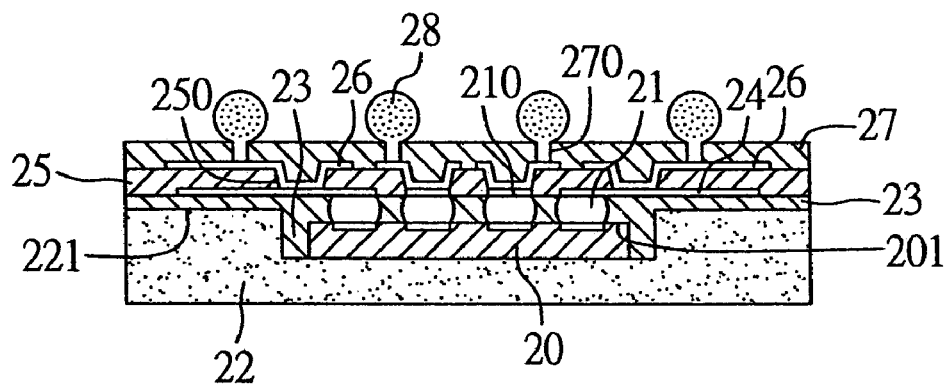
Figure 3:
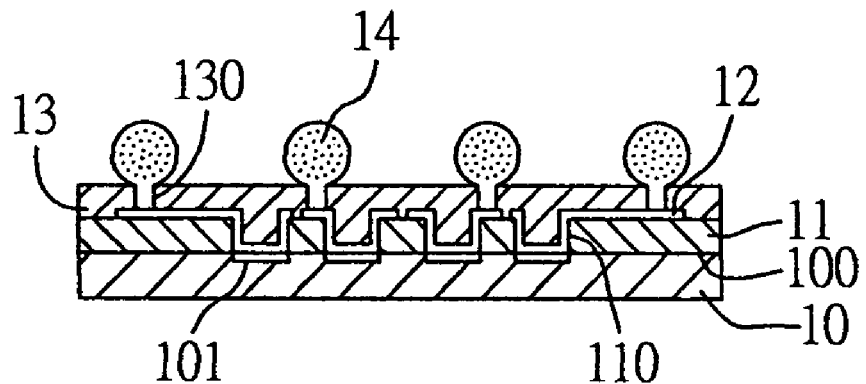
FIG. 3 (PRIOR ART) is a cross-sectional view of a conventional semiconductor package.
Figure 4:
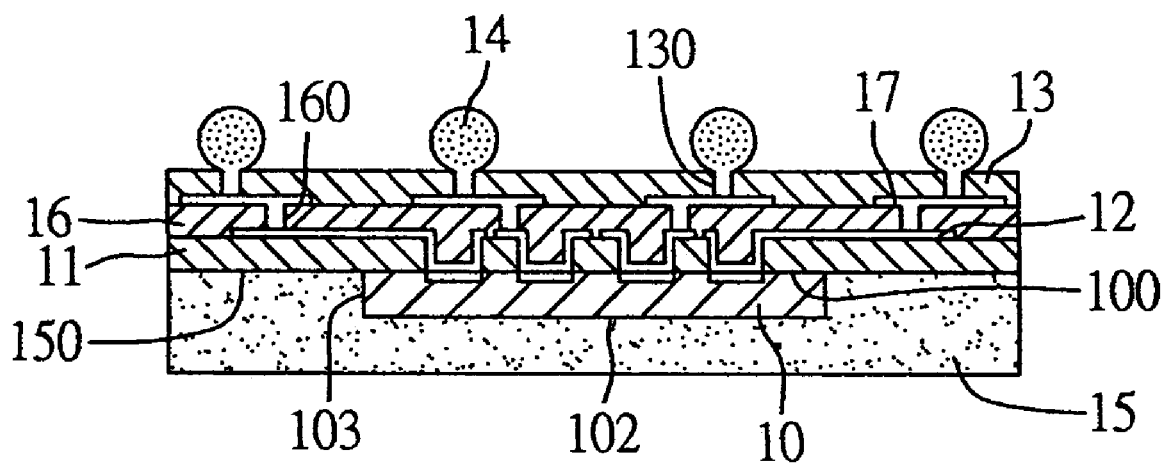
FIG. 4 (PRIOR ART) is a cross-sectional view of another conventional semiconductor package.

Referring to FIG. 2F, a solder mask layer 27 is disposed over the second conductive traces 26 and formed with a plurality of openings 270 via which predetermined portions of the second conductive traces 26 are exposed; the exposed portions of the second conductive traces 26 can be terminals. Finally, a solder ball 28 is formed by e.g. a conventional screen printing technique on each of the exposed portions (terminals) of the second conductive traces 26. The solder balls 28 serve as input/output (I/O) connections for the semiconductor package to electrically connect the chip 20 to an external device such as printed circuit board (not shown).

In the above semiconductor package according to the invention, a plurality of conductive bumps are directly formed on the bond pads of the chip, and then a first dielectric layer is coated over the chip and the carrier for accommodating the chip and encapsulates the conductive bumps with ends of the conductive bumps being exposed. As a result, positions of the bond pads are easily recognized and distinguished by the exposed ends of the conductive bumps, such that conductive traces subsequently formed on the first dielectric layer can be well electrically connected through the conductive bumps to the bond pads, thereby improving yield of the fabricated packages. Therefore, the semiconductor package according to the invention, without having to form vias through the first dielectric layer to expose bond pads on the chip, is advantageous over the prior art whose bond pads of the chip cannot be precisely or completely exposed by vias formed through the first dielectric layer in the use of a laser drilling technique and which leads to the drawback of degraded electrical connection between the incompletely-exposed bond pads and conductive traces formed on the first dielectric layer. Moreover, the carrier for accommodating the chip according to the invention can be a metallic heat sink which effectively dissipates. heat produced from the chip, thereby improving the heat dissipating efficiency of the semiconductor package.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method of a semiconductor package with build-up layers formed on a chip, comprising the steps of:
   preparing a wafer comprising a plurality of chips, each of the chips having an active surface and a non-active surface and formed with a plurality of bond pads on the active surface;
   forming a conductive bump on each of the bond pads of the chips;
   singulating the wafer to form a plurality of single chips each having a plurality of the conductive bumps thereon;
   providing a carrier having a cavity for receiving at least one of the chips therein, wherein the non-active surface of the chip is attached to a bottom surface of the cavity, and the conductive bumps are positioned within the cavity and partly protruded from the cavity;
   applying a first dielectric layer over the active surface of the chip and the carrier, wherein the first dielectric layer fills in the cavity and encapsulates the conductive bumps with ends of the conductive bumps being exposed without forming vias through the first dielectric layer; and
   forming a plurality of first conductive traces on the first dielectric layer, and allowing the first conductive traces to be electrically connected to the exposed ends of the conductive bumps.

2. The fabrication method of claim 1, further comprising a step of: applying a second dielectric layer over the first conductive traces and forming a plurality of vias through the second dielectric layer, so as to allow predetermined portions of the first conductive traces to be exposed by the vias.

3. The fabrication method of claim 2, further comprising a step of: forming a plurality of second conductive traces on the second dielectric layer, and allowing the second conductive traces to be electrically connected to the exposed portions of the first conductive traces.

4. The fabrication method of claim 3, further comprising a step of: applying a solder mask layer over the second conductive traces and forming a plurality of openings through the solder mask layer, so as to allow predetermined portions of the second conductive traces to be exposed via the openings.

5. The fabrication method of claim 4, further comprising a step of: forming a solder ball on each of the exposed portions of the second conductive traces.

6. The fabrication method of claim 1, wherein the first dielectric layer is partly removed to expose the ends of the conductive bumps.

7. The fabrication method of claim 2, wherein the vias of the second dielectric layer are formed by a laser drilling technique.

8. The fabrication method of claim 6, wherein the first dielectric layer is partly removed by a mechanical grinding technique to expose the ends of the conductive bumps.

9. The fabrication method of claim 6, wherein the first dielectric layer is partly removed by a chemical etching technique to expose the ends of the conductive bumps.

10. The fabrication method of claim 1, wherein the conductive bump is selected from the group consisting of a solder bump, a gold (Au) bump, and an Au stud bump.

11. The fabrication method of claim 1, wherein the carrier is made of a non-conductive material.

12. The fabrication method of claim 1, wherein the carrier is a metallic heat sink.

* * * * *